METHOD OF MANUFACTURING SEMICONDUCTOR DEVICES

Filed Feb. 17, 1971

INVENTORS
SHOJIRO ASAI, MOTOHISA HIRAO
AND EIICHI MARUYAMA

BY Craig, Antonelli, Stewart & Hill
ATTORNEYS

3,697,338
METHOD OF MANUFACTURING SEMICONDUCTOR DEVICES

Shojiro Asai, Hachioji, Motohisa Hirao, Tokyo, and Eiichi Maruyama, Kodaira, Japan, assignors to Hitachi, Ltd., Tokyo, Japan Filed Feb. 17, 1971, Ser. No. 116,133
Claims priority, application Japan, Feb. 18, 1970, 45/13,484
Int. Cl. H01l 7/44
U.S. Cl. 148—188 5 Claims

ABSTRACT OF THE DISCLOSURE

A method of manufacturing semiconductor devices by solid-solid diffusion wherein a Group III–VI compound such as $Ga_2S_3$, $Al_2S_3$, etc. is deposited on a substrate of a Group III–V compound semiconductor such as GaAS, GaP, etc., and the Group VI element is diffused into the Group III–V compound semiconductor.

BACKGROUND OF THE INVENTION

Field of the invention

The present invention relates to a method of manufacturing semiconductor devices.

Description of the prior art

Heretofore, the diffusion of a donor impurity such as S, Se, Sn, Te or the like into a single crystal substrate of Group III–V compound semiconductor such as GaAs and GaP has commonly been performed by the so-called closed tube vapor phase diffusion method in which a donor element and a crystal such as GaAs and GaP into which the donor element is to be diffused are sealed together with an excess amount of As or P which prevents the dissociation of As or P from the crystal in a quartz ampoule.

This method has the disadvantage that the surface of a semiconductor substrate to be processed becomes very rough because of the alloying which occurs at the surface of the semiconductor substrate owing to high vapor pressures of the donor and As or P at the diffusion temperature and a high reactivity. There is also the disadvantageous phenomenon that the composition element such as As and P evaporates from the surface of the semiconductor substrate and moves to other places in the ampoule because a compound having a high vapor pressure is produced on the surface of the semiconductor substrate.

There are further inconveniences in the closed tube vapor diffusion method in that the weighing of the single crystal substrate of GaAs or GaP, the donor impurity, and the excess As or P and the maintenance of a constant volume of the ampoule must be effected.

There is also known the method that as a donor impurity to be diffused into a GaAs substrate a sulphide, selenide or telluride of Ga, Al or In is employed. This method is also carried out by the closed tube vapor phase diffusion method in which diffusion is carried out by sealing the substrate and the compound together in an ampoule.

There is a similar method of diffusing boron into a silicon substrate in which a Si substrate and a BN wafer are placed adjacently to each other and subjected to heat treatment in an inert gas stream. This is a vapor phase diffusion in an open tube method.

There is a further technique known as the solid-solid diffusion method. This method is such that $SiO_2$ doped with a diffusing material such as P, B, Zn or the like is deposited on a semiconductor substrate of Si, GaAs or the like and the structure is heated to diffuse the diffusing material into the substrate.

SUMMARY OF THE INVENTION

An object of the present invention is to provide a diffusion method which obviates the above-mentioned disadvantages present when a donor impurity is diffused into a semiconductor substrate of a Group III–V compound by the conventional vapor diffusion method and which is also essentially different from the conventional vapor diffusion employing a compound such as $Al_2S_3$ or BN as a diffusion material and the solid phase diffusion from an oxide doped with a donor impurity.

According to the present invention there is provided a solid-solid diffusion method in which a Group III–VI compound such as $Ga_2S_3$, $Al_2S_3$, $Ga_2Se_3$, $Al_2Se_3$, GaS or the like is deposited on the substrate of a Group III–V compound semiconductor such as GaAs, GaP, $$GaAs_{1-x}P_x$$

$GaAl_{1-x}As_x$ or the like, a solid phase redistribution of the principal component elements, the elements of the Groups V and VI, is effected between the Group III–V compound and the Group III–VI compound.

That is, according to this invention, a solid-solid diffusion of a donor impurity is effected from a Group III–VI compound into a semiconductor substrate by depositing the Group III–VI compound doped with a small amount of As or P or both on the semiconductor substrate consisting of GaAs, GaP or the like, to be diffused and by heating the structure to a temperature below the eutectic point of the Group III–VI compound and the semiconductor to be processed.

In this case an open tube method employing a diffusion furnace with a suitable inert gas stream and evacuation equipment is possible while preventing the dissociation of As or P in the semiconductor by covering the entire surface of the structure with an $SiO_2$ layer.

Since this method is a solid-solid diffusion method, the surface of the semiconductor substrate to be processed does not become rough, the labor of weighing the materials and sealing the ampoule are eliminated, and reproducible diffusion is possible.

DESCRIPTION OF THE PREFERRED EMBODIMENTS

Embodiments of the present invention will be described with reference to the accompanying drawing.

EXAMPLE 1

An example of the present invention applied to the manufacture of a GaAs p-n junction diode will first be described.

First, a (100) p-type GaAs single crystal substrate doped with Zn or Cd to a concentration of $10^{16}$ cm.$^{-3}$ is polished and then etched in a solution of $$H_2SO_4:H_2O_2:H_2O=3:1:1$$

Next, a material of $Ga_2S_3$ including 1/100 by weight of As is deposited on the GaAs substrate to a thickness of about 1 micron by, for example, vacuum evaporation.

Further, an $SiO_2$ film is deposited to a thickness of about 0.5 micron on the entire surface of the structure either by oxidizing $SiH_4$ at 400° C. or by sputtering $SiO_2$.

Figure 1:
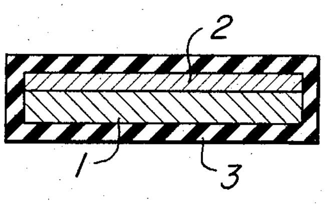
FIG. 1 is a sectional diagram of a structure to be diffused for the manufacture of a p-n junction diode.

By these processes a sample for diffusion as shown in FIG. 1 is provided in which reference numeral 1 designates a GaAs substrate, numeral 2 designates a deposited $Ga_2S_3$ layer containing As, and numeral 3 designates a deposited $SiO_2$ layer.

Figure 2:
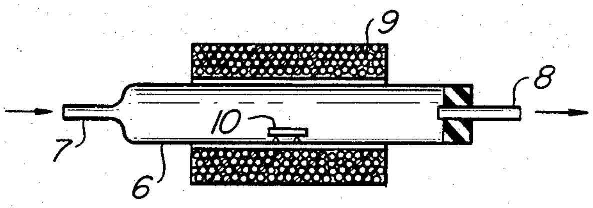
FIG. 2 is a schematic diagram of a diffusion apparatus employed in this invention.

The diffusion process will next be described with reference to FIG. 2 which is a schematic diagram of an apparatus for diffusion. In FIG. 2, reference numeral 6 designates a quartz tube having a gas intake port 7 and a gas exhaust port 8, reference numeral 9 designates an electric furnace provided around the quartz tube 6, and numeral 10 designates the sample for diffusion shown in FIG. 1. The sample 10 for diffusion is heated at 900° C. by the electric furnace 9 while allowing a high purity inert gas, such as $N_2$, Ar or He, to flow through the quartz tube 6. During this process S in the deposited $Ga_2As_3$ diffuses into the GaAs substrate to form a p-n junction therein.

To remove the deposited $SiO_2$ film 3 from the sample, a solution of 50% hydrofluoric acid:neutral ammonium fluoride =1:6 is employed, and to remove the deposited $Ga_2S_3$ layer 2, an alkaline solution such as NaOH and KOH is employed.

The reason why the diffusion temperature is selected to be 900° C. is that GaAs and $Ga_2S_3$ form a eutectic crystal at about 940° C. At a temperature lower than this temperature S can be introduced into the GaAs substrate by a solid phase diffusion between GaAs and $Ga_2S_3$.

The reason why a small amount of As is mixed in $Ga_2S_3$ is that such inclusion is desirable to prevent any dissociation of GaAs.

The above description has been made as to the case where $Ga_2S_3$ is employed as a donor impurity source. However, another group of II–VI compounds such as $Al_2S_3$, $In_2S_3$, $Al_2Te_3$, GaS, AlS or GaSe can be substituted therefor.

EXAMPLE 2

A description will next be made regarding the application of the present invention to the manufacture of a GaAs Gunn diode.

First, a semi-insulating GaAs substrate is polished and etched similarly to Example 1.

Next, an n-type GaAs crystal having a carrier concentration of $1 \times 10^{15}$ cm.$^{-3}$ is epitaxially grown thereon by a vapor phase method.

Then, an $SiO_2$ film as a diffusion mask is deposited at a predetermined position on the n-type GaAs crystal to a thickness of 3000 angstroms by, for example, vapor phase chemical evaporation by means of the oxidation of $SiH_4$ at 400° C.

Further, $Ga_2S_3$ containing As is deposited on the crystal in the same manner as with Example 1, and $SiO_2$ is deposited over the entire surface of the structure.

Figure 3:
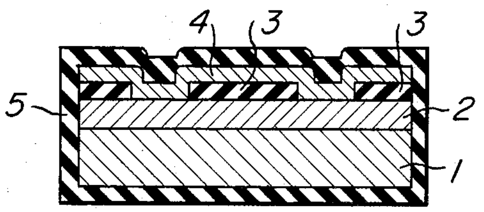
FIG. 3 is a sectional diagram of a structure to be diffused for the manufacture of a Gunn diode.

By the above processes a sample for diffusion as shown in FIG. 3 is provided. In FIG. 3 reference numeral 1 designates a semi-insulating GaAs substrate, numeral 2 designates an n-type epitaxial GaAs crystal, numeral 3 designates an $SiO_2$ film for a diffusion mask, numeral 4 designates a deposited $Ga_2S_3$ layer containing As, and numeral 5 designates a deposited $SiO_2$ layer.

When this sample for diffusion is placed in the apparatus of FIG. 3 and diffusion is performed at 900° C. for 20 hours, an S diffused layer having a thickness of about 8 microns is selectively formed in the epitaxial GaAs crystal. By alloying metal electrodes on the thus formed $N^+$ type GaAs crystal, a planar Gunn diode can be formed.

The above-mentioned method of forming the $N^+$ type electrode part by a solid-solid diffusion is better in reproducibility and accuracy than the conventional method of forming an $N^+$ type electrode by the selective liquid phase or vapor phase growth method, and moreover, the length of the active N part for high frequency oscillation and logical operation can be reduced from about 100 microns, the limit of the conventional technique, to about 10 microns.

It is to be noted that the method according to the present invention can be effectively also applied to the diffusion process for GaAs transistors, GaAs light-emitting diodes and the like.

We claim:

1. A method of manufacturing a semiconductor device comprising the steps of depositing a Group III–VI compound containing a donor impurity on a Group III–V compound semiconductor substrate, and heating the structure to a temperature lower than the eutectic point of said Group III–V compound semiconductor and said Group III–VI compound to diffuse said donor impurity into said Group III–V compound semiconductor substrate by solid-solid diffusion.

2. A method of manufacturing a semiconductor device according to claim 1, wherein a small amount of at least one of As and P is deposited on said Group III–V compound semiconductor substrate simultaneously with the deposition of said Group III–VI compound containing said donor impurity.

3. A method of manufacturing a semiconductor device according to claim 2, comprising the step of depositing, after said deposition of said Group III–VI compound and at least one of said As and P, $SiO_2$ over the entire surface of the structure.

4. A method of manufacturing a semiconductor device according to claim 1, comprising the step of depositing, after said deposition of said Group III–VI compound containing said donor impurity on said Group III–V compound semiconductor substrate, $SiO_2$ over the entire surface of the structure.

5. A method of manufacturing a semiconductor device according to claim 1, wherein said Group III–VI compound is one selected from the group consisting of $Ga_2S_3$, $Al_2S_3$, $In_2S_3$, $Al_2Te_3$, $Ga_2Se_3$, GaS, AlS and GaSe.

References Cited

UNITED STATES PATENTS

| | | | |
|---|---|---|---|
| 3,224,913 | 12/1965 | Ruehrwein | 148—175 |
| 3,279,963 | 10/1966 | Castrucci et al. | 148—188 |
| 3,287,187 | 11/1966 | Rosenheinrich | 148—187 |
| 3,312,571 | 4/1967 | Ruehrwein | 148—175 |
| 3,462,323 | 8/1969 | Groves | 148—175 |
| 3,502,518 | 3/1970 | Antell | 148—186 |
| 3,532,564 | 10/1970 | Gittler | 148—188 |
| 3,591,429 | 7/1971 | Clawson et al. | 148—175 |

GEORGE T. OZAKI, Primary Examiner

U.S. Cl. X.R.

148—175, 186, 187